United States Patent
Lin et al.

(10) Patent No.: US 11,296,256 B2
(45) Date of Patent: Apr. 5, 2022

(54) LIGHT-EMITTING DIODE

(71) Applicant: XIAMEN SAN'AN OPTOELECTRONICS CO., LTD., Xiamen (CN)

(72) Inventors: Wen-Yu Lin, Xiamen (CN); Meng-Hsin Yeh, Xiamen (CN); Yun-Ming Lo, Xiamen (CN); Chien-Yao Tseng, Xiamen (CN); Chung-Ying Chang, Xiamen (CN)

(73) Assignee: Xiamen San'An Optoelectronics Co., Ltd., Xiamen (CN)

( * ) Notice: Subject to any disclaimer, the term of this patent is extended or adjusted under 35 U.S.C. 154(b) by 129 days.

(21) Appl. No.: 16/883,585

(22) Filed: May 26, 2020

(65) Prior Publication Data

US 2020/0287083 A1 Sep. 10, 2020

Related U.S. Application Data

(63) Continuation-in-part of application No. PCT/CN2018/113517, filed on Nov. 1, 2018.

(30) Foreign Application Priority Data

Nov. 28, 2017 (CN) .......................... 201711218871.0

(51) Int. Cl.
 *H01L 33/28* (2010.01)
 *H01L 25/075* (2006.01)
(52) U.S. Cl.
 CPC ........ *H01L 33/285* (2013.01); *H01L 25/0756* (2013.01)

(58) Field of Classification Search
 None
 See application file for complete search history.

(56) References Cited

U.S. PATENT DOCUMENTS

| | | | |
|---|---|---|---|
| 2003/0005880 A1 | 1/2003 | Razeghi | |
| 2003/0047744 A1* | 3/2003 | Yanamoto | B82Y 20/00 257/98 |

(Continued)

FOREIGN PATENT DOCUMENTS

| | | |
|---|---|---|
| CN | 1698215 | 11/2005 |
| CN | 102881789 | 1/2013 |

(Continued)

OTHER PUBLICATIONS

International Search Report in PCT/CN2018/113517 dated Feb. 13, 2019.

*Primary Examiner* — Khaja Ahmad
(74) *Attorney, Agent, or Firm* — Thomas | Horstemeyer, LLP

(57) ABSTRACT

A light-emitting diode includes an N-type cladding layer, and a superlattice structure, an active layer, a P-type electron-blocking layer, and a P-type cladding layer disposed on the N-type cladding layer in such order. The superlattice structure includes at least one first layered element which has first, second, and third sub-layers that are stacked on one another in a direction away from the N-type cladding layer. The first, second, and third sub-layers have energy band gaps $Eg1$, $Eg2$, and $Eg3$ which satisfy a relationship of $Eg1<Eg2<Eg3$. In addition, $Eg3$ is greater than an energy band gap of the P-type electron-blocking layer.

20 Claims, 5 Drawing Sheets

(56) References Cited

U.S. PATENT DOCUMENTS

| | | | | |
|---|---|---|---|---|
| 2012/0119254 A1* | 5/2012 | Moon | .................. | H01L 33/025 |
| | | | | 257/101 |
| 2012/0236307 A1* | 9/2012 | Sekiguchi | ....... | H01L 31/035236 |
| | | | | 356/402 |
| 2013/0292638 A1* | 11/2013 | Shur | ...................... | H01L 33/06 |
| | | | | 257/13 |
| 2016/0343901 A1* | 11/2016 | Shur | ...................... | H01L 24/00 |

FOREIGN PATENT DOCUMENTS

| | | |
|---|---|---|
| CN | 107819058 | 3/2018 |
| CN | 107919415 | 4/2018 |
| CN | 207624727 | 7/2018 |
| JP | H08125207 | 5/1996 |

\* cited by examiner

LIGHT-EMITTING DIODE

CROSS-REFERENCE TO RELATED APPLICATION

This application is a bypass continuation-in-part (CIP) application of PCT International Application No. PCT/CN2018/113517, filed on Nov. 1, 2018, which claims priority of Chinese Invention Patent Application No. 201711218871.0, filed on Nov. 28, 2017. The entire content of each of the International and Chinese patent applications is incorporated herein by reference.

FIELD

This disclosure relates to a light-emitting diode, and more particularly to a light-emitting diode including a superlattice structure having a large energy band gap.

BACKGROUND

A light-emitting diode (LED) device is a solid-state lighting device made of p-type and n-type semiconductor materials, and a p-n junction therebetween serves as a diode which directly converts electrical energy into light energy. In a conventional face-up LED device having a growth substrate made of sapphire, the LED is prone to damage under a high electric current due to poor heat dissipation of the LED device. Therefore, development of LEDs that can be operated under high electric current without being burned out has received increased interest in the industry, and a current mainstream product is a high power vertical LED. Further, a vertical thin film (VTF) LED has been developed based on the high power vertical LED. Since the VTF LED can be operated under high electric current to provide a high light output power, and has high reliability and stability under a relatively high temperature, it has been used as a major light source in ultraviolet (UV) curing field. Design requirements for an epitaxial structure of the VTF LED are increasing to improve a light output power thereof.

In a conventional LED, an epitaxial structure includes an N-type cladding layer, a superlattice layer, an active layer, a P-type electron-blocking layer (EBL), and a P-type cladding layer sequentially formed on a growth substrate. The P-type EBL having a large energy band gap aims to prevent electron leakage and to increase a rate of radiative-recombination in the LED. Several types of EBLs have been developed, such as EBL with gradually varying aluminum content, EBL having a superlattice structure (e.g., aluminum gallium nitride (AlGaN)/gallium nitride, aluminum nitride/AlGaN, AlGaN/indium gallium nitride superlattice structure, etc.), and polarization-matched EBL (e.g., aluminum indium nitride (AlInN) EBL). Taking AlInGaN-based UV LED as an example, FIG. 1 shows secondary ion mass spectrometry (SIMS) profiles of Al, In, and Ga atom concentrations in the epitaxial structure. Since an energy band gap is proportional to an Al content (i.e., Al intensity) and inversely proportional to an In content (i.e., In intensity), it can be found that the P-type EBL has a highest Al intensity (i.e., the largest energy band gap) in the epitaxial structure. Compared to the P-type EBL, the superlattice layer, which is usually composed of periodic structure of InGaN/AlGaN, has a lower Al intensity and an In content, and therefore has a lower energy band gap.

However, even though the conventional LEDs can be operated under high electric current due to the presence of epitaxial structures which includes P-type EBLs that has large energy band gap, they are still incapable of providing a desired light output power.

Therefore, it has remained a goal to develop an LED which not only can be operated under high electric current, but also provides a high light output power.

SUMMARY

Therefore, an object of the disclosure is to provide a light-emitting diode (LED) that can alleviate or eliminate at least one of the drawbacks of the prior art.

According to the disclosure, the LED includes an N-type cladding layer, a superlattice structure disposed on the N-type cladding layer, an active layer disposed on the superlattice structure, a P-type electron-blocking layer disposed on the active layer, and a P-type cladding layer disposed on the P-type electron-blocking layer.

The superlattice structure includes a first superlattice unit that contains at least one first layered element. The first layered element has a first sub-layer, a second sub-layer, and a third sub-layer that are stacked on one another in a direction away from the N-type cladding layer. The first, second, and third sub-layers have a first energy band gap (Eg1), a second energy band gap (Eg2), and a third energy band gap (Eg3) which satisfy a relationship of Eg1<Eg2<Eg3. The third energy band gap (Eg3) of the third sub-layer is greater than an energy band gap (Eg4) of the P-type electron-blocking layer.

BRIEF DESCRIPTION OF THE DRAWINGS

Other features and advantages of the disclosure will become apparent in the following detailed description of the embodiment (s) with reference to the accompanying drawings, in which.

DETAILED DESCRIPTION

Figure 1:
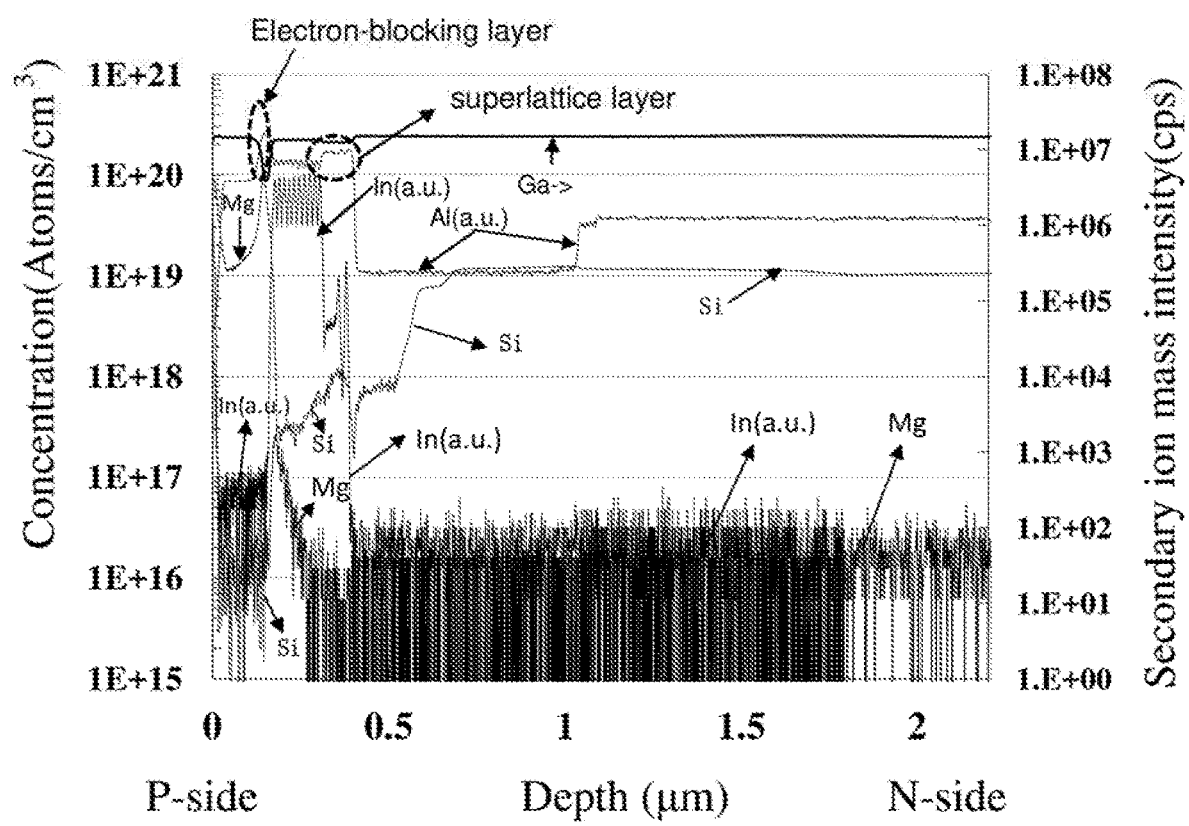
FIG. 1 is a secondary ion mass spectrometry (SIMS) depth profile from a P-type cladding layer (P-side) to an N-type cladding layer (N-side) of an epitaxial structure of a conventional light-emitting diode (LED)

Before the disclosure is described in greater detail, it should be noted that where considered appropriate, reference numerals have been repeated among the figures to indicate corresponding or analogous elements, which may optionally have similar characteristics.

Figure 2:
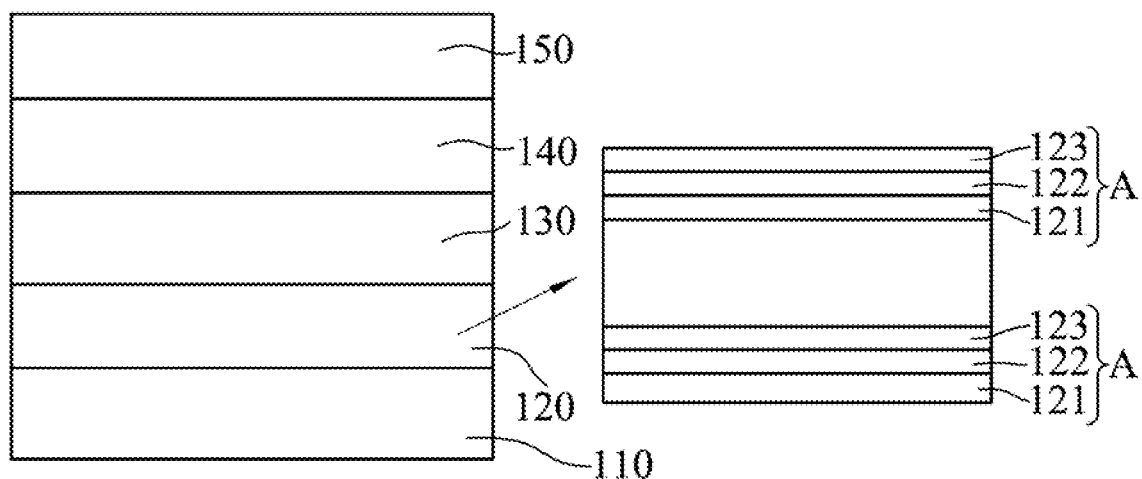
FIG. 2 is a schematic view illustrating a first embodiment of an LED according to the disclosure.

Referring to FIG. 2, a first embodiment of the light-emitting diode (LED) according to the disclosure includes an N-type cladding layer 110, and a superlattice structure 120, an active layer 130, a P-type electron-blocking layer (EBL) 140, and a P-type cladding layer 150 disposed on the N-type cladding layer 110 in such order. The LED may have a vertical structure (i.e., vertical LED) which includes a support substrate for supporting the abovementioned components of the LED. Alternatively, the LED may have a lateral structure (i.e., lateral LED) which includes a growth substrate for epitaxial growth of the abovementioned components of the LSD. The vertical LED is more suitable for use under a condition of high electric current (e.g., greater than 1 A/mm$^2$) as compared to the lateral LED.

The N-type cladding layer 110 and the P-type cladding layer 150 may be independently made of a nitride-based semiconductor material, and each has an energy band gap larger than that of the active layer 130. For example, the N-type cladding layer 110 and the P-type cladding layer 150 may be made of an aluminum gallium nitride (AlGaN)-based material or a gallium nitride (GaN)-based material.

The active layer 130 includes a multiple quantum well having a plurality of potential barrier layers and a plurality of potential well layers that are alternately stacked. The potential barrier layers and the potential well layers may be made of any suitable semiconductor materials (such as a nitride-based semiconductor material) which are chosen depending on an emission wavelength of light to be emitted therefrom (e.g., within a range of 210 nm to 570 nm). For example, the potential barrier layers may be made of a material including aluminum (Al) (e.g., aluminum indium gallium nitride (AlInGaN) or AlGaN), in which an Al content may be not greater than 15%, and the potential well layers may be made of a nitride-based semiconductor material. In this embodiment, the potential barrier layers are made of AlGaN-based materials, and the potential well layers are made of InGaN-based materials. The active layer 130 is configured to emit light having an emission wavelength that ranges from 360 nm to 420 nm.

The P-type EBL 140 may be made of a nitride-based semiconductor material including Al, and has an energy band gap greater than that of the P-type cladding layer 150. The P-type EBL 140 may be formed as a single layer or multiple layers (e.g., to form a superlattice structure). In this embodiment, the P-type EBL 140 is made of AlGaN.

The superlattice structure 120 includes at least one first layered element (A). In this embodiment, the superlattice structure 120 includes a plurality of the first layered elements (A), which are arranged periodically and cooperatively form a first superlattice unit. Each of the first layered elements (A) has a first sub-layer 121, a second sub-layer 122, and a third sub-layer 123. The first sub-layers 121, the second sub-layers 122, and the third sub-layers 123 in the first superlattice unit are alternately stacked on one another in a direction away from the N-type cladding layer 110.

For each of the first layered elements (A), the first, second and third sub-layers 121, 122, 123 have a first energy band gap (Eg1), a second energy band gap (Eg2), and a third energy band gap (Eg3), respectively, which satisfy a relationship of Eg1<Eg2<Eg3. In addition, the third energy band gap (Eg3) of the third sub-layer 123 is greater than an energy band gap (Eg4) of the P-type EBL 140.

The superlattice structure 120 may be made of a nitride-based semiconductor material. In certain embodiments, the superlattice structure 120 is unintentionally doped. For example, for each of the first layered elements (A), the first sub-layer 121 may be made of an indium gallium nitride (InGaN)-based material represented by a formula of In$_x$Ga$_{(1-x)}$N (where x is within a range of 0 to 0.2), the second-sublayer 122 may be made of an AlGaN-based material represented by a formula of Al$_y$Ga$_{(1-y)}$N (where y is within a range of 0 to 0.3), and the third sub-layer 123 may be made of an aluminum nitride (AlN)-based material. That is, the first sub-layer 121 may have an indium (In) content ranging from 0 mol % to 20 mol % based on a total molar amount of In and gallium (Ga) in the first sub-layer 121. The second sub-layer 122 may have an Al content ranging from 0 mol % to 30 mol % based on a total molar amount of Al and Ga in the second sub-layer 122.

In this embodiment, the first sub-layer 121 is made of InGaN, the second sub-layer 122 is made of AlGaN, and the third sub-layer 123 is made of AlN (i.e., each of the first layered element (A) includes InGaN/AlGaN/AlN). Alternatively, each of the first layered elements (A) may include GaN/AlGaN/AlN or InGaN/GaN/AlN.

The first superlattice unit of the superlattice structure 120 may include at least 3 of the first layered elements (A). In certain embodiments, the first superlattice unit includes 3 to 30 of the first layered elements (A). In other embodiments, the first superlattice unit, includes 15 to 20 of the first layered elements (A). The superlattice structure 120 may have a total thickness ranging from 100 Å to 3000 Å. Each of the first, second and third sub-layers 121, 122, 123 may have a thickness of less than 100 Å, such as a thickness ranging from 20 Å to 30 Å.

The second sub-layers 122 in the first superlattice unit may have gradually varying Al contents, e.g., for every 1 to 5 of the first layered elements (A). In certain embodiments, one of the second sub-layers 122 in the first superlattice unit that is closest to the N-type cladding layer 110 has a highest Al content, and a remainder of the second sub-layers 122 in the first superlattice unit have Al contents that decrease by 1 mol % to 5 mol % (e.g., 3 mol %) in a stepwise manner along a direction away from the N-type cladding layer 110.

By formation of the third sub-layers 123 in the first layered elements (A) having a large energy band gap that is greater than that of the P-type electron-blocking layer 140, the superlattice structure 120 not only can slow down the movement of electrons but also reduce hole overflow, so as to increase the recombination efficiency in the active layer 130, thereby improving the luminous efficiency of the LED of this disclosure. In addition, the superlattice structure 120 can reduce thermal droop of the LED operated at elevated temperature, so as to improve thermal stability of the LED. In certain embodiments, the LED of this disclosure may have a hot/cold (H/C) factor of not less than 0.7 under a current of 500 mA, which is measured as a ratio of a light output power of the LED at 85° C. (i.e., hot) to the light output power of the LED at 25° C. (i.e., cold).

Figure 5:
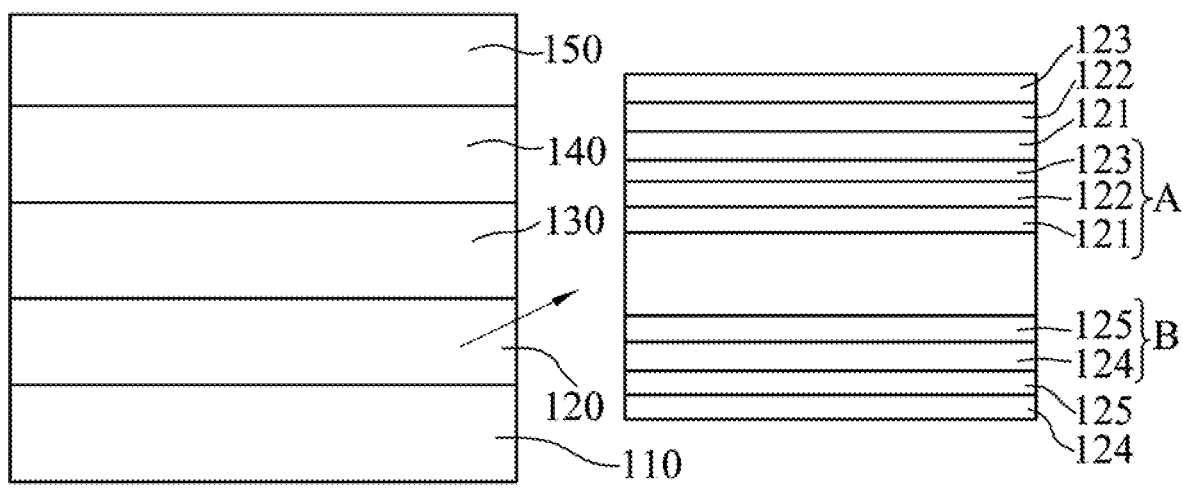
FIG. 5 is a schematic view illustrating a second embodiment of the LED of the disclosure.

Referring to FIG. 5, a second embodiment of the LED according to the disclosure is similar to the first embodiment, except that the superlattice structure 120 in the second embodiment further includes a second superlattice unit that contains at least one second layered element (B) which has a fourth sub-layer 124 and a fifth sub-layer 125. In certain embodiments, the second superlattice unit of the superlattice structure 120 includes at least 5 of the second periodical layered elements (B). For example, the second superlattice unit may include 5 to 20 of the second layered elements (B). The fourth sub-layers 124 and the fifth sub-layers 125 in the second superlattice unit are alternately stacked on one another in a direction away from the N-type cladding layer 110.

Moreover, in this embodiment, the first superlattice unit is disposed adjacent to the active layer 130, and the second superlattice unit is disposed adjacent to the N-type cladding layer 110. For each of the secondlayered elements (B), the fourth sub-layer 124 and the fifth sub-layer 125 may be made of materials different from those for making the first sub-layer 121, the second sub-layer 122, and the third sub-layer 123. Alternatively, the fourth sub-layer 124 and the fifth sub-layer 125 may be made of different materials that are independently selected from materials for making the first sub-layer 121, the second sub-layer 122, and the third sub-layer 123. In this embodiment, each of the fourth sub-layer 124 is made of a material for making the first sub-layer 121 in the first embodiment (i.e., InGaN), and each of the fifth sub-layer 125 is made of a material for making the second sub-layer 122 in the first embodiment (i.e., AlGaN). Each of the second sub-layers 122 in the first superlattice unit may have a same Al content (i.e., a first Al content), and each of the fifth sub-layers 125 in the second superlattice unit may have a same Al content (i.e., a second Al content). The first Al content differs from the second Al content, e.g., by 1 mol % to 5 mol %.

A third embodiment of the LED according to the disclosure is similar to the second embodiment, except that in the third embodiment, the first superlattice unit is disposed adjacent to the N-type cladding layer 110, and the second superlattice unit is disposed adjacent to the active layer 130. Since the first layered elements (A) of the first superlattice unit, which have relatively large energy band gaps, are disposed farther away from the active layer 130 in this embodiment, each of the first to third sub-layers 121, 122, 123 may have a greater thickness (e.g., 50 Å), and the first superlattice unit may include fewer first layered elements (A) as compared to the second embodiment.

A fourth embodiment of the LED according to the disclosure is similar to the second embodiment, except that in the fourth embodiment, the superlattice structure 120 further includes a third superlattice unit that contains one or more third layered elements (C) and that is disposed adjacent to the active layer 30. The first superlattice unit is disposed between the second and third superlattice units. Each of the third layered elements (C) may have a sixth sub-layer that is made of one of the materials for making the first sub-layer 121 and the second sub-layer 122, and a seventh sub-layer that is made of a material for making the third sub-layer 123. The sixth sub-layers and the seventh sub-layers in the third superlattice unit are alternately stacked on one another in a direction away from the N-type cladding layer 110. In this embodiment, the superlattice structure 120 includes 3 to 10 of the first layered elements (A), 1 to 10 of the second layered elements (B), and 1 to 5 of the third layered elements (C).

The disclosure will be further described by way of the following examples. However, it should be understood that the following examples are solely intended for the purpose of illustration and should not be construed as limiting the disclosure in practice.

EXAMPLES

Experimental Sample 1 (E1)

An LED of Experimental sample 1 (E1) has a vertical structure similar to that of the first embodiment of the LED shown in FIG. 2, and emits light having a wavelength within a range of 380 nm to 390 nm.

For each of the first layered elements (A) of the superlattice structure 120, the first sub-layer 121, the second sub-layer 122, and the third sub-layer 123 are respectively made of InGaN, AlGaN, and AlN. Each of the third sub-layers 123 of the superlattice structure 120 has an energy band gap greater than that of the P-type electron-blocking layer 140. The compositions of other layers are the same as those described in the first embodiment.

Comparative Sample 1 (C1)

An LED of Comparative sample 1 (C1) is similar to E1 except that the third sub-layer 123 are omitted from the superlattice structure 120. In other words, each of the first layered elements (A) only has the first sub-layer 121 (i.e., made of InGaN) and the second sub-layer 122 (i.e., made of AlGaN).

Evaluations

1. Change of light output power over emission wavelength:

Two wafers, which include about 1400 LEDs of E1 and 1400 LEDS of C1 (each having a size of 45 mils×45 mils), respectively, were subjected to determination of light output power at a wavelength ranging from 382 nm to 386 nm using an LED tester (Manufacturer: Wei Ming Industrial Co., Ltd; Model: LED-2627V20).

Figure 3:
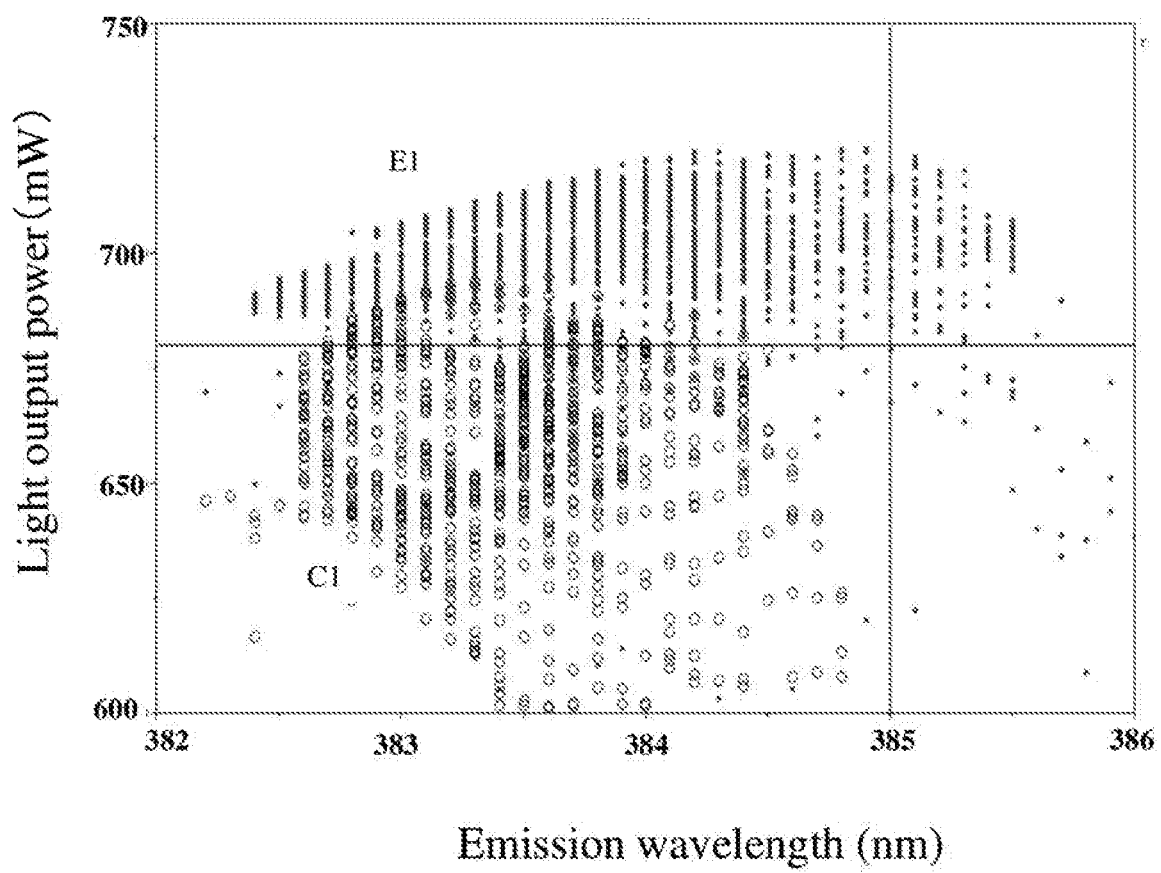
FIG. 3 is a scatter plot illustrating light output power of the LEDs of Experimental sample 1 (E1) and Comparative sample 1 (C1) at different emission wavelengths, in which E1 is denoted by a pattern "x", and C1 is denoted by a pattern "◇"

As shown in FIG. 3, when compared to C1, the LEDs of E1 have significantly higher light output power at the determined wavelength range (i.e., from 382 nm to 386 nm), indicating that in the presence of the third sub-layers 123 in the superlattice structure 120 which has energy band gap greater than that of the P-type electron-blocking layer 140, the luminance of the LED according to this disclosure can be greatly enhanced.

2. Hot/Cold (H/C) Factor:

The LEDs of E1 and C1 (each having a size of 45 mils×45 mils) were subjected to determination of the light output power at 25° C. and at 85° C. under a current of 500 mA. The hot/cold factor of the LED was calculated based on the ratio of the obtained light output power of the LED at 85° C. to that at 25° C.

Figure 4:
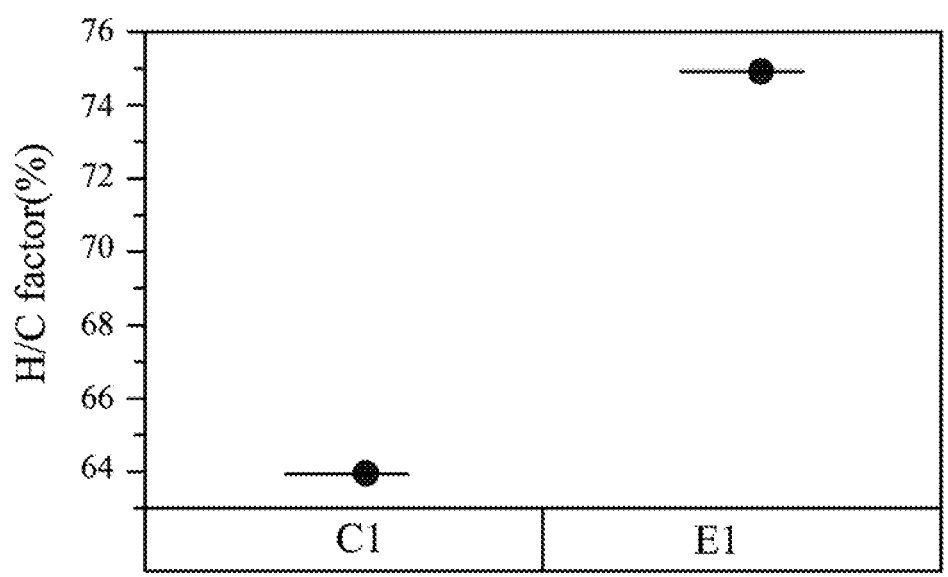
FIG. 4 is a plot showing hot/cold factors of the LEDs of E1 and C1.

Referring to FIG. 4, the LEDs of E1 and C1 have hot/cold factors of 0.74 and 0.64, respectively. It can thus be concluded that by formation of the third sub-layers 123 in the superlattice structure 120, the hot/cold factor of the LED of this disclosure can be increased, thereby improving thermal stability thereof.

3. Aging test:

Each of the LEDs of E1 and C1 was subjected to an aging test described as fellows. To be specific, each LED was lit up for 48 hours or 96 hours under a current of 700 mA and at a junction temperature of 125° C. An initial light output power ($LOP_i$), anaged light output power ($LOP_{48/96}$), an aged forward voltage ($Vf_{48/96}$) and an aged reverse current ($IR_{48/96}$) of each LED were measured. A decay rate of light, a change of the forward voltage ($\Delta Vf$) between an initial forward voltage ($Vf_i$) (i.e., when the LED was not lit up) and the aged forward voltage, and a change of the reverse current ($\Delta IR$) between an initial reverse current ($IR_i$) and the aged reverse current were respectively calculated based on the formulas below:

Decay rate of light=$(LOP_{48/96}/LOP_i) \times 100\%$ $\Delta Vf = Vf_{48/96} - Vf_i$;

$\Delta IR = IR_{48/96} - IR_i$.

The aging test was repeated twice and denoted as tests (a) and (b) in Table 1.

TABLE 1

| | Tests | Time (hr) | Decay rate of light (%) | $\Delta Vf$ (V) | $\Delta IR$ ($\mu A$) |
|---|---|---|---|---|---|
| E1 | (a) | 48 | 98.50 | −0.002 | 0.00 |
| | | 96 | 97.53 | −0.004 | 0.01 |
| | (b) | 48 | 97.61 | −0.006 | 0.00 |
| | | 96 | 96.08 | −0.007 | 0.00 |
| C1 | (a) | 48 | 95.37 | −0.002 | 0.13 |

TABLE 1-continued

| Tests | Time (hr) | Decay rate of light (%) | ΔVf (V) | ΔIR (μÅ) |
|---|---|---|---|---|
| | 96 | 94.33 | −0.007 | 0.21 |
| (b) | 48 | 94.24 | −0.003 | 0.28 |
| | 96 | 93.33 | −0.012 | 0.33 |

As shown in Table 1, while the LEDs of E1 and C1 have similar ΔVf values, the decay rate of light and ΔIR in E1 are improved compared to those of C1, indicating that the LED of this disclosure, which has the third sub-layers 123 in the superlattice structure 120, exhibits improved durability.

In sum, by formation of the superlattice structure having a large energy band gap, the LED of this disclosure may have an improved thermal stability and an increased light output power.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode, comprising:
an N-type cladding layer;
a superlattice structure disposed on said N-type cladding layer;
an active layer disposed on said superlattice structure;
a P-type electron-blocking layer disposed on said active layer; and
a P-type cladding layer disposed on said P-type electron-blocking layer,
wherein:
said superlattice structure includes a first superlattice unit that contains at least one first layered element, said first layered element having a first sub-layer, a second sub-layer and a third sub-layer stacked on one another in a direction away from said N-type cladding layer;
said first, second and third sub-layers have a first energy band gap (Eg1), a second energy band gap (Eg2), and a third energy band gap (Eg3) which satisfy a relationship of Eg1<Eg2<Eg3; and
the third energy band gap (Eg3) of said third sub-layer is greater than an energy band gap of said P-type electron-blocking layer.

2. The light-emitting diode according to claim 1, wherein said active layer (130) is configured to emit light having a wavelength ranging from 360 nm to 420 nm.

3. The light-emitting diode according to claim 1, having a hot/cold (H/C) factor of not less than 70% under a current of 500 mA, wherein said hot/cold factor is measured as a percentage ratio of a light output power of said light-emitting diode at 85° C. to the light output power of said light-emitting diode at 25° C.

4. The light-emitting diode according to claim 1, wherein said first superlattice unit includes a plurality of said first layered elements, said first sub-layers, said second sub-layers and said third sub-layers in said first layered element being alternately stacked on one another in the direction away from said N-type cladding layer.

5. The light-emitting diode according to claim 4, wherein said superlattice structure includes at least 3 of said first layered elements.

6. The light-emitting diode according to claim 1, wherein said superlattice structure further includes a second superlattice unit that contains at least one second layered element, said second layered element having a fourth sub-layer and a fifth sub-layer.

7. The light-emitting diode according to claim 6, wherein said fourth sub-layer and said fifth sub-layer are made of different materials that are independently selected from materials for making said first sub-layer, said second sub-layer, and said third sub-layer.

8. The light-emitting diode according to claim 6, wherein said second superlattice unit includes a plurality of said second layered elements, said fourth sub-layers and said fifth sub-layers in said second superlattice unit being alternately stacked.

9. The light-emitting diode according to claim 1, wherein said first, second and third sub-layers are respectively made of an indium gallium nitride (InGaN)-based material, an aluminum gallium nitride (AlGaN)-based material, and an aluminum nitride (AlN)-based material.

10. The light-emitting diode according to claim 1, wherein said first, second and third sub-layers are respectively made of a gallium nitride (GaN)-based material, an AlGaN-based material, and an AlN-based material.

11. The light-emitting diode according to claim 1, wherein said first, second and third sub-layers are respectively made of an InGaN-based material, a GaN-based material, and an AlN-based material.

12. The light-emitting diode according to claim 5, wherein said superlattice structure includes 3 to 30 of said first layered elements.

13. The light-emitting diode according to claim 1, wherein said superlattice structure has a total thickness ranging from 100 Å to 3000 Å.

14. The light-emitting diode according to claim 1, wherein each of said first, second and third sub-layers has a thickness of less than 100 Å.

15. The light-emitting diode according to claim 9, wherein, said first sub-layer has an indium (In) content ranging from 0 mol % to 20 mol % based on a total molar amount of In and gallium (Ga) in said first sub-layer, and said second sub-layer has an aluminum (Al) content ranging from 0 mol % to 30 mol % based on a total molar amount of Al and Ga in said second sub-layer.

16. The light-emitting diode according to claim 15, wherein said first superlattice unit includes a plurality of said first layered elements, one of said second sub-layers in said first superlattice unit that is closest to said N-type cladding layer having a highest aluminum (Al) content, and a remainder of said second sub-layers in said first superlattice unit having Al contents that decrease by 1 mol % to 5 mol % in a stepwise manner along a direction away from said N-type cladding layer.

17. The light-emitting diode according to claim 1, wherein said active layer includes a multiple quantum well structure having a plurality of potential barrier layers that are made of a AlGaN-based material and a plurality of potential well layers that are made of an InGaN-based material, said potential barrier layers and said potential well layers being alternately stacked.

18. A light-emitting diode, comprising:
an N-type cladding layer;
a superlattice structure disposed on said N-type cladding layer;
an active layer disposed on said superlattice structure;
a P-type electron-blocking layer disposed on said active layer; and
a P-type cladding layer disposed on said P-type electron-blocking layer,
wherein:
said superlattice structure includes a first superlattice unit that contains a plurality of first periodical layered elements, each of said first periodical layered elements having a first sub-layer, a second sub-layer and a third sub-layer, said first sub-layers, said second sub-layers and said third sub-layers in said first periodical layered elements being alternately stacked on one another in a direction away from said N-type cladding layer;
for each of said first periodical layered elements, said first, second and third sub-layers have a first energy band gap (Eg1), a second energy band gap (Eg2), and a third energy band gap (Eg3) which satisfy a relationship of Eg1<Eg2<Eg3; and
the third energy band gap (Eg3) of said third sub-layer is greater than an energy band gap of said P-type electron-blocking layer.

19. The light-emitting diode according to claim 18, wherein said superlattice structure includes at least 3 of said first periodical layered elements (A).

20. The light-emitting diode according to claim 18, wherein for each of said first periodical layered elements, said first, second and third sub-layers are respectively made of an indium gallium nitride (InGaN)-based material, an aluminum gallium nitride (AlGaN)-based material, and an aluminum nitride (AlN)-based material.

* * * * *